United States Patent [19]

Kammerlander

[11] 4,320,516
[45] Mar. 16, 1982

[54] CIRCUIT FOR ASCERTAINING OF THE PHASE JITTER OF DIGITAL SIGNALS

[75] Inventor: Karl Kammerlander, Wolfratshausen, Fed. Rep. of Germany

[73] Assignee: Siemens Aktiengesellschaft, Berlin & Munich, Fed. Rep. of Germany

[21] Appl. No.: 83,299

[22] Filed: Oct. 10, 1979

[30] Foreign Application Priority Data

Oct. 24, 1978 [DE] Fed. Rep. of Germany ....... 2846271

[51] Int. Cl.³ .............................................. H03B 3/04
[52] U.S. Cl. ...................................... 375/10; 375/118
[58] Field of Search .................. 375/10, 97, 110, 118; 328/155; 371/64

[56] References Cited

U.S. PATENT DOCUMENTS

| | | | |
|---|---|---|---|
| 3,544,717 | 12/1970 | Smith | 375/118 |
| 3,728,524 | 4/1973 | Gray | 340/789 |
| 3,798,650 | 3/1974 | McComas | 375/118 |
| 4,032,884 | 6/1977 | Gutleber | 371/64 |
| 4,052,557 | 10/1977 | Chiu | 375/10 |
| 4,131,856 | 12/1978 | Chapman | 375/118 |

*Primary Examiner*—Harold I. Pitts
*Attorney, Agent, or Firm*—Hill, Van Santen, Steadman, Chiara & Simpson

[57] ABSTRACT

A circuit for the asynchronous measurement of the phase jitter of an incoming signal, at least a part of which is digital, includes a differentiator for sensing pulse transitions of the incoming signal and a periodic function generator resetable by the differentiated pulses. Function valves generated by the function generator coincident with the differentiated pulses are added together and averaged to form an average value of phase jitter based on the number of incoming signal transitions that are sensed.

28 Claims, 10 Drawing Figures

CIRCUIT FOR ASCERTAINING OF THE PHASE JITTER OF DIGITAL SIGNALS

BACKGROUND OF THE INVENTION

1. Field of the Invention

The invention pertains to distortion sensing apparatus for use with telecommunications links.

2. The Prior Art

In the case of transmission of digital signals by means of radio, and in the specific case of adaptive procedures incorporated into the design of send-receive stations, such as mobile receiving stations, there exists a need to monitor the receivability of these signals, in order to differentiate them from interferences and faulty signals. As soon as a signal is faulty over a certain degree, the danger exists that falsifications or losses of the message content will occur. The degree of the interference of signals is generally expressed as signal/noise ratio S/N, which corresponds to the energy relationship of the wanted signal $P_s$ to the unwanted signal $P_N$.

$$S/N = 10 \cdot \lg(P_s/P_N) dB \tag{1}$$

In the case of transmission of digital signals, or digital signallings, the effective signal/noise ratio expresses itself in the so-called "phase jitter" of the digital signal. The jitter magnitude J is a measure of the mean percental dispersion or variation of zero passages of the digital signal in the base band, with reference to the undistorted length of an individual bit.

The receivability of incoming signals on a transmission link such as a radio link may be ascertained by making use of a field strength measurement. The field strength alone indeed is not a complete measure of signal quality, as interferences which overlay the actual desired signal can produce an apparently sufficient signal field strength. As the German OS No. 2,659,635 shows, it is necessary to monitor the receivability of an incoming signal not only by means of a field strength measurement, but also or exclusively by means of a phase jitter measurement.

A phase jitter measurement can be carried out by means of a time window, by means of which the regenerated digital signal on the receiver side is observed and the mean percental dispersion of the zero passage of the pulse edges is determined. Such a measurement, however, presumes that the regenerator on the receiver side is adjusted, by means of a reference frequency, to the bit rate of the incoming signal with sufficient accuracy. This reference frequency is produced by means of a local clock pulse oscillator whose output can be controlled by means of a phase regulating loop. As soon as the synchronization of the phase regulating loop has occurred, both the beginning as well as the end of each received signal bit are known at the receiving location. Such an arrangement is specified in the German No. AS 2,047,944. In general, the band width of the phase regulating loop is selected small enough that an interference free reference signal is delivered by the clock pulse oscillator. This reference signal defines the beginning and the end of the undistorted receiver-side bits even in the case of relatively low values of S/N by means of an integrating mean value formation of the phase regulating loop.

The above described form of phase jitter measurement of the incoming signal is disadvantageous because it presumes that the phase regulating loop of the regenerator has been synchronized. Therefore, the measurement of the quality of the signal which is received can only be made after synchronization has taken place. Also disadvantageous is that in the case of a decreasing signal/noise ratio S/N, the necessary interference free reference signal can only be obtained by correspondingly reducing the band width of the phase regulating loop. This, however, leads to longer synchronizing times. Thus, the lost time before the quality measurement may be taken increases with a decreasing signal-to-noise ratio. If no synchronization can occur because the signal-to-noise ratio S/N is too low, or the interference is too high, then the non-receivability of the incoming signal can be determined only after a corresponding waiting time, which corresponds to the maximum synchronizing time.

The mentioned disadvantages are particularly aggravated in the case of fast frequency changeable and adaptive radio systems, which function either with frequency jump methods, automatic channel seeking or other frequency variation devices. The minimum times which are necessary in the case of such radio systems for the adaptation processes to take place are significantly enlarged because of the phase jitter measurement. In the case of distorted radio channels, large intervals of time can pass before a determination can be made that the connection is unsuitable.

Thus, there is an unfilled need for an apparatus and method to quickly measure phase jitter which does not require a synchronized regenerator in the receiver unit.

SUMMARY OF THE INVENTION

The invention is a method and associated apparatus which interact with known receiver circuits for asynchronously measuring the phase jitter of an incoming signal which has at least a digital portion. The inventive apparatus includes a differentiating circuit, or means for sensing transitions, which converts the transitions or edges of the incoming digital signals, or, respectively, signal portions into pulses of a selected polarity. The output of this differentiating circuit is connected to a control input of at least one time function generator or means for generating a selected, periodic time varying function. The time function generator generates a non-synchronized, free running, periodic time function. Instantaneous time function values of the output signal of that time function generator, defined by the appearance of transition initiating pulses from the differentiator circuit are supplied to an evaluating circuit. The evaluating circuit forms a mean value of the sensed instantaneous function values over a selected time period. The time function generator is also reset to an initial condition by each output pulse from the differentiator.

The invention is based upon the understanding that the phase jitter measurement of an incoming digital signal which is necessary for a quality judgment can be carried out asynchronously, provided, there exists a time function generator which is controlled by the transitions of the incoming signal, and provided further that the time function generator is stable enough so that the output pulse stream or function which it generates may be used to accurately measure the bit duration of the incoming, sequential signal over a selected interval of time. Extensive investigations have shown that the required degree of accuracy may be obtained by the use of current, conventional circuitry technology.

A practical apparatus results if the period of the time function generator is chosen to be equal to the expected bit period of the incoming signal.

The time function generator may be implemented as an analog or a digital device. In an analog embodiment, a function generator in the form of a sawtooth or a triangle generator is practical. In a digital embodiment, it is useful to provide a bi-directional counter which is controlled by a counting cycle pulse generator. The counting cycle pulse generator displays a significantly higher timing pulse frequency than the bit timing pulse of the received signal.

It is desirable to undertake the phase jitter measurement of the incoming digital signals, or respectively, digital signallings, in the base band level of the signal after the incoming signal has passed through the base band clipper or limiter.

In a further embodiment of the invention, a differentiating circuit with two output lines is used. One output line displays a pulse corresponding to each positive transition or edge of the incoming signal. The other output line displays a pulse corresponding to each negative going transition or edge of the incoming digital signal bit sequence.

Two identical time function generators are provided where two transition indicating streams of pulses are generated. The control input of each generator is connected to one of the output lines of the differentiating circuit. The time function value outputs of each generator are connected with associated inputs of an evaluating circuit. In this manner, among other things, falsifications of the measurement results of the phase jitter which are caused by fluctuations of the mark-space ratio of the incoming signal bit sequence can be suppressed. Such mark-space ratio fluctuations represent a d.c. or zero frequency component of the base signal which overlies the digital signal. This component occurs because of drifts of frequency generators, unsymmetries in filters, modulators, coupling links and operational amplifiers.

A practical evaluating circuit includes an adder which is connected to the outputs as the time function generator, or generators. The evaluating circuit includes further an event counter which is connected to the output, or outputs of the differentiating circuits, and an evaluator. The evaluator has one input which is connected to the output of the event counter. The contents of the event counter indicates the number of input signal transitions that occurred in a predetermined set measuring block. The other input of the evaluator senses the sum of the function values which are added up in the adder during the same measuring block interval. In the simplest case, the evaluator consists of a divider or ratio former.

If a differentiating circuit is used which has two outputs, one for a transition indicating pulse stream derived from upward-going transitions of the input signal and a second for a transition indicating pulse stream derived from downgoing transitions of the input signal, in combination with two identical time function generators, the superimposed d.c. component may be eliminated from the measure of the phase jitter.

In another embodiment of the invention, the d.c. component of the incoming signal may be measured and used for regulating purposes. To accomplish this measurement, the evaluating circuit further includes a comparator which is clocked by the transition indicating pulses which appear at one of the two outputs of the differentiating circuit. The evaluating circuit also includes an integrator which is connected to the output of the comparator. The integrator is reset periodically in conjunction with a measuring test block length. The evaluation circuit also includes an additional ratio former, or divider. One input of the second ratio former is connected to the integrator output. The other input of the second ratio former is fed a value corresponding to one-half of the count in the event counter periodically in conjunction with the measuring test block length. Additionally, each of the two inputs of the comparator is connected with an additional time function output of one of the two time function generators. The output of the additional ratio former is a signal proportional in size and magnitude to the d.c. component of the incoming signal, which may be used to adjust or equalize the bit time intervals of a signal corresponding to the incoming signal.

If a longer measuring time is allowed, then the phase jitter can also be measured satisfactorily independently of the presence of a d.c. component in the incoming signal using a differentiating circuit which has only one output and which generates a stream of transition indicating pulses corresponding only to upward-going transitions of the incoming signal or corresponding only to downward-going transitions in the incoming signal.

If the phase jitter measurement is employed solely for monitoring the signal-to-noise ratio of directional radio links or tropo-scatter links, then the evaluating circuit can be reduced to a coincidence circuit with storage characteristics.

If the phase jitter measurement is to be made in the case of radio systems of higher flexibility for automatic adaptation to the best receiving relationships in each case, then it is useful to construct the evaluator out of a microprocessor with two input memories which can be accessed by the microprocessor. The microprocessor then provides the logic necessary for the automatic adaptation of the radio system.

The invention is also suited in an advantageous manner for the measurement of the phase jitter of short digital identification characters of duration of but few milliseconds. The phase jitter measurement which is activated here only during the identification blocks thereby proceeds from an arrangement which makes use of a differentiating circuit with two outputs of two time function generators. It is practical in this case to form the evaluating circuit of a microprocessor with four memories. These memories can be accessed by the microprocessor. Two memories are connected so as to be able to store the function value outputs of the two time function generators. Two memories are connected so as to sense the transition indicating pulses at the outputs of the differentiating circuit. The microprocessor compares the incoming indentification blocks continuously with an identification character pattern which has been pre-stored. At the same time, it monitors the quality of the received signal with the help of the phase jitter measurement. As a result, the microprocessor generates a measure of the faults which have been sensed in the comparison of the incoming identification character block with the desired bit pattern.

The circuit according to the invention in a further embodiment also can be used in the synchronizing device for the time pulse generator of a radio receiver. A regulating signal for the oscillator which is controlled in its phase and/or frequency is obtained via a phase comparison of the time pulse oscillator oscillation with the incoming signal. In the connection path between the output of the phase comparer and the set input of the time pulse generator, a controllable switch is provided. The switch is controlled by the output signal of the evaluator of the evaluating circuit via a threshold circuit and interrupts the regulating signal supply always when and as long as this output signal registers an inadmissably high phase jitter value. The interruption of the phase or frequency readjustment of the time pulse oscillator in this manner represents a significant improvement of the operating characteristics of such a radio receiver, because in the case of interferences which occur for a short period of time, uncontrolled drifting of the time pulse oscillator is suppressed.

A method of improving the phase or frequency regulation of the receiver time base oscillator comprises the steps of asynchronously determining the phase jitter of the incoming signal, sensing the magnitude of the determined phase jitter, interrupting, in a predetermined fashion, a phase or frequency adjusting feedback loop of the receiver time base oscillator when the determined phase jitter exceeds a selected threshold.

Further, the circuit for the measurement of the signal-to-noise ratio S/N in an analog transmission channel can be used according to the invention in a further design at a terminal station of a message transmission link for analog signals. On the send side, into the analog signal flow are mixed digital identification character blocks of the duration of few milliseconds at time intervals on the order of magnitude of seconds. The indentification character blocks are extracted time-synchronously on the receiving side and are fed to the input of the jitter measuring device for the determination of the S/N values. Holes in the receive side analog signal flow are filled by means of an analog echo signal generated by means of a shift register.

A method of measuring the signal-to-noise ratio of an analog communications channel concurrently with transmission of analog messages comprises the steps of interlacing periodically selected digital code blocks with the analog message, at selected time intervals, at the transmitter end; sensing the interlaced digital code blocks at the receive end; measuring the phase jitter of the digital code blocks periodically to form an indicia proportional to the signal-to-noise ratio of the analog channel.

DETAILED DESCRIPTION OF PREFERRED EMBODIMENTS

Not by way of limitation, but by way of disclosing the best mode of practicing my invention and by way of enabling one of skill in the art to practice my invention, there are disclosed in FIGS. 1 to 10 several alternate embodiments of my invention.

Figure 1:
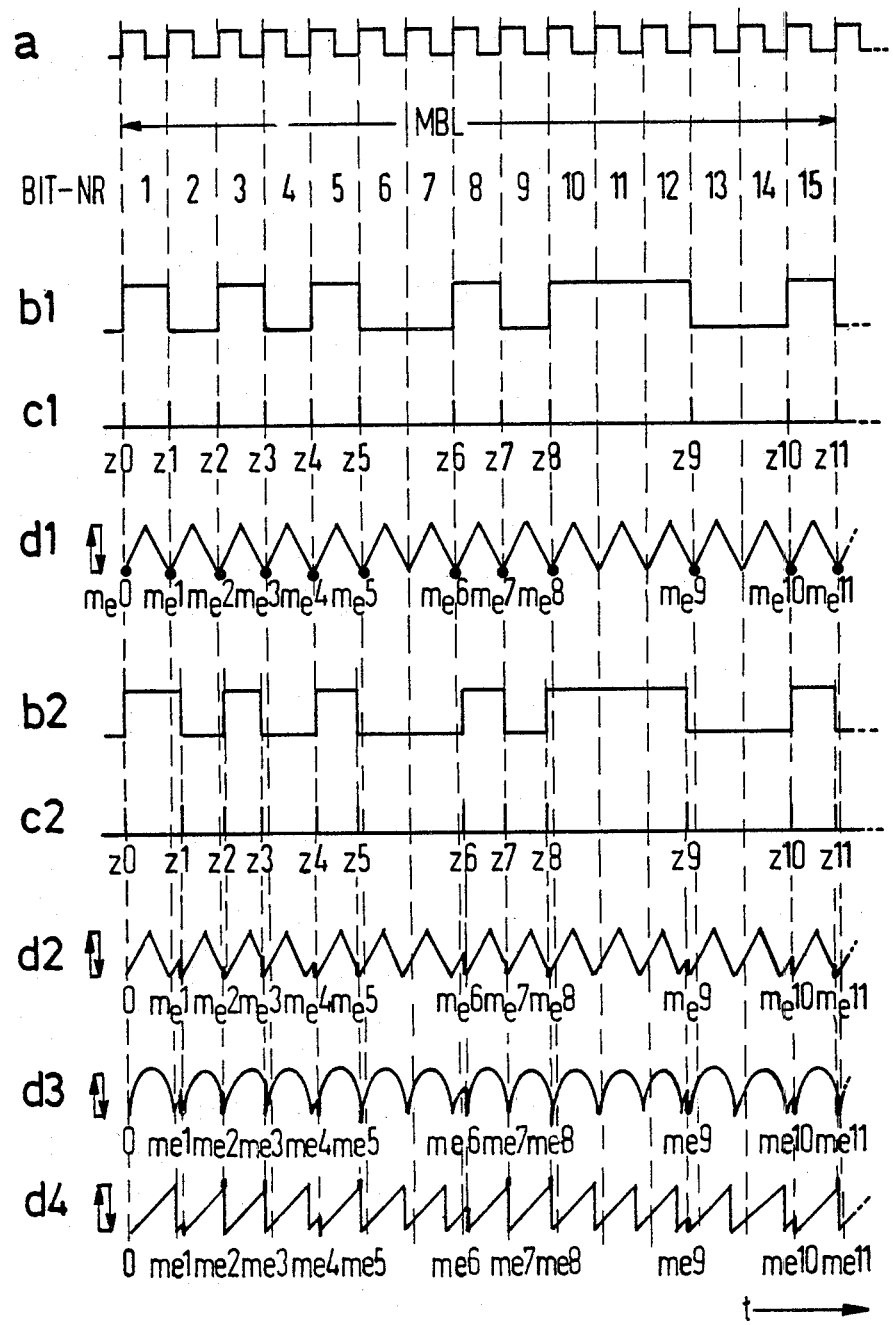
FIG. 1 is a series of voltage waveforms plotted over time which assist in understanding the present invention.
Figure 2:
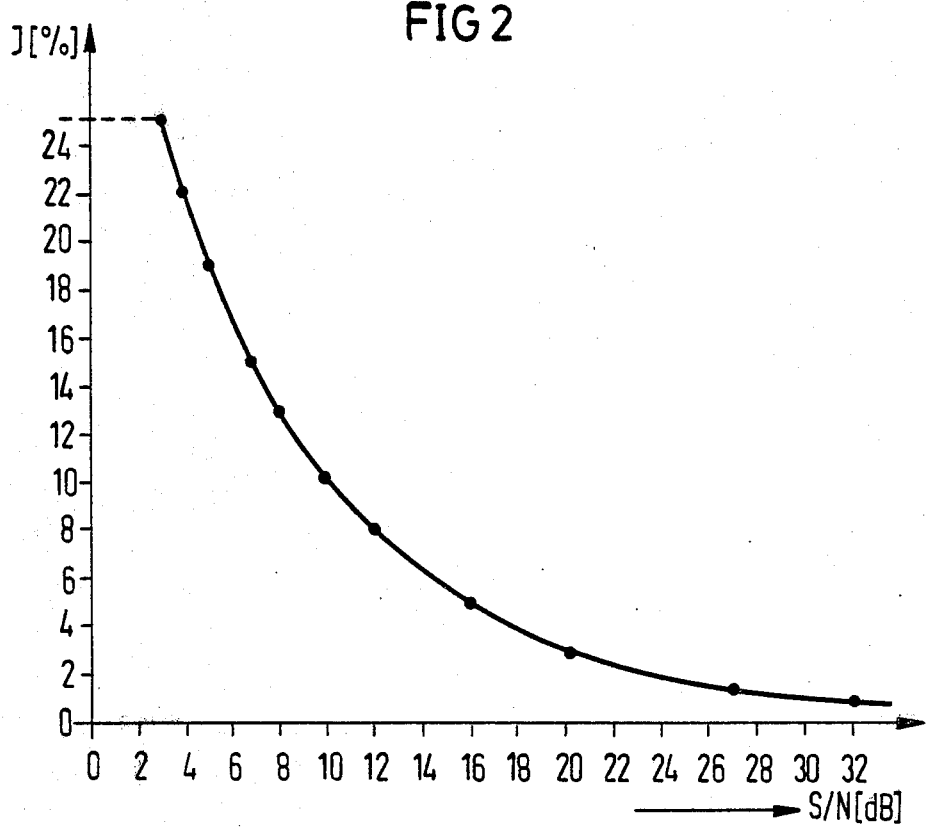
FIG. 2 is a graph which shows the relationship between phase jitter and the signal-to-noise ratio of an incoming signal.

To explain the inventive measuring method, in FIG. 1 a series of voltage diagrams are plotted versus time t. The diagram "a" shows a time pulse signal which is generated by a receiver-side oscillator. The waveform of diagram "a" has a period which corresponds exactly to the bit period, with which the signal to be received is transmitted from the send side. This time pulse signal is represented in diagram "a" of FIG. 1 for fifteen bits 1, 2, ... 15. These fifteen bits represent a measuring or test block length MBL. Underneath the bit numbers labelled NR, in diagram "b1", an exemplary undistorted, digital, demodulated, base band-receive signal is drawn as a function of time. The ascending and descending edges of the signal of diagram "b1" coincide exactly with the positive edges of the time pulse signal according to the diagram "a". The diagram "c1" shows a series of unidirectional signal pulses $z_0, z_1, \ldots z_{11}$, which are derived from the receive signal b1 by means of differentiation of the transitions or edges of the incoming signal in diagram "b1".

The diagram d1 represents the output signal of a digital time function generator. The output signal of the diagram "d1" is generated by counting an up-down counter. The counter is driven with a counting frequency $f_z$, which is higher by a factor or $2^7$ than the bit time pulse frequency $f_b$ of the time pulse signal of diagram "a". The counter is designed such that, starting from a count of zero, it counts 64 counting steps or pulses upward and then 64 down. It thus arrives at its beginning count of zero after one bit-time has elapsed on the diagram "b1" or after one pulse cycle has occurred on the diagram "a".

The counter has a reset input, to which the transition indicating pulses according to diagram "c1" are applied. Thus, by means of the counting function, embodied by the counter, each bit-time of the diagram "b1" is counted. A value or measurement of the counting function is obtained in this manner corresponding to each pulse $Z_1, Z_2 \ldots Z_{11}$. This results in a set of measuring values $me1, me2 \ldots me11$ measured over a measuring or test block length MBL. The measuring values $me1, m32 \ldots me11$ are supplied to an evaluating circuit which is still to be defined. In the diagram d1, these measuring values, $me1, me2 \ldots me11$, which are marked with black points, are in each case zero, since the incoming digital signal is undistorted.

The function values $me1, me2 \ldots me11$ change if the incoming digital signal, corresponding to diagram "d2" displays a phase jitter. With a phase jitter, the incoming signal edges no longer coincide exactly with the positive edges of the time pulse signal of diagram "a". In the diagram "c2", the transition indicating pulses $z_0, z_1 \ldots z_{11}$ for the signal of diagram "b2" are plotted. The pulses of diagram "c2" are displaced with respect to the pulses of diagram "c1".

The time function of the time function generator as shown in diagram "d2" now no longer coincides in its zero passages with the transition indicating pulses of the diagram "c2". The occurrence of each of the pulses of the diagram "c2" resets the up-down counter to its zero count in each case. Before the resetting, the measurement result, which here exists in the instantaneous count of the counter, is passed on to the evaluating circuit. The measurement results me1, me2, . . . me11 are thus no longer zero and produce a signal at the output of the evaluating circuit. This signal indicates the magnitude of the jitter.

In the diagrams "d3" and "d4", which correspond to the diagram "d2", time functions of analog time function generators are shown. The time function according to diagram "d3" has a magnitude which increases and then again decreases within a period corresponding to the period of the signal of diagram "a". The shape of the function of diagram "d3" is non-linear and is constructed such that it compensates, in percentage, for the non-linear relationship between the jitter J and the signal-to-noise ratio S/N in dB of FIG. 2. In this simple manner, it is possible that the magnitude delivered by the evaluating circuit to be proportional to the signal-to-noise ratio and to this extent makes possible a linear indication of the signal-to-noise ratio.

The diagram "d4" shows the time function course of a time function generator, which is a sawtooth generator, and the sawtooth period of which again coincides with a bit time pulse. Depending on whether the measurement results me1, me2 . . . me11 are determined in the lower or in the upper voltage range of the sawtooth waveform, information is obtained directly concerning the direction of the momentary phase shift of the zero passages of the digital incoming signal. Other time functions are also usable. For example, a counting function period could also extend over tso bit-periods or bit times. This fact becomes important if only signal edges of one polarity of the incoming signal of diagram "b2" are utilized as inputs to a differentiator.

Figure 4:
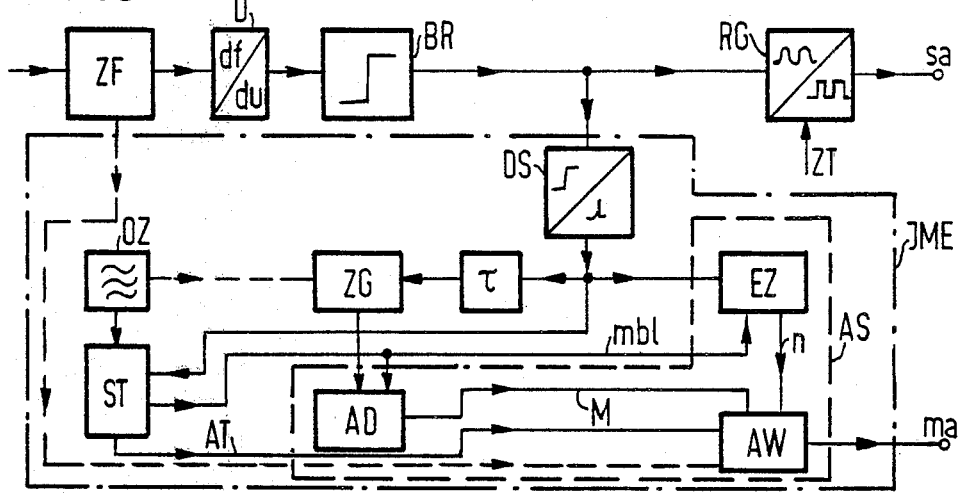
FIG. 4 is a block diagram of a first exemplary circuit practicing the method of the invention.

A first embodiment of a circuit for the measurement of phase jitter is represented in FIG. 4. The circuit of FIG. 4 includes a part of the receive-side signal path of an FM radio receiver with an intermediate frequency circuit ZF on the left side, onto which a demodulator D is connected. In the demodulator D, the digital signal which is received is converted from the intermediate frequency position into the base band position. The demodulator D is followed by a base band limiter BR, which is connected to the input of a regenerator RG. For the signal regeneration which is to be carried out in the regenerator RG, the signal time pulse ZT is necessary. The pulse train ZT is delivered by a time pulse generator which is not represented and which is brought into synchronism with the incoming signal sequence by means of a phase regulating loop. On the output side of the regenerator RG, the regenerated digital signal can be recovered for its further processing in the base band position at the output sa.

The actual jitter measurement device JME comprises a differentiating circuit DS, which is connected at its input to the output of the base band limiter or clipper BR. Further, the jitter measurement device includes a time delay $\tau$, a time function generator ZG, an event counter EZ, an adder AD, an evaluator AW and a control device ST, which is connected to a free-running oscillator OZ of sufficiently stable frequency.

The differentiating circuit DS generates the input signal transition indicating pulses, previously referred to with respect to diagram "c1" and "c2" of FIG. 1. The pulses generated by the differentiator DS are fed to the input of the event counter EZ, the control device ST and, via the time delay device $\tau$, to the reset input of the time function generator ZG. If the time function generator ZG is an up-down counter, as was specified in connection with FIG. 1 in the diagrams "d1" and "d2", then its counting input is connected to an output of the oscillator OZ. The oscillator OZ delivers pulses with a frequency equal to the count frequency fz.

The time function value output of the time function generator ZG is connected with the adder AD. In the adder AD the measured values me1, me2 . . . me11 are added up over a measuring or test block length MBL according to FIG. 1. The control signal which contains the measuring or test block length is fed by the control device ST to the adder AD and to the event counter EZ. At the end of a measuring or test block interval, the adder AD releases a sum measured result M corresponding to the sum of the values me1, me2, . . . me11 to the evaluator AW. The value n in the event counter EZ corresponds to the total number of transition pulses sensed during the interval MBL. The sum n is a second input to the evaluator AW. At an output ma of the evaluator AW, a signal appears whose magnitude is proportional to the jitter J, or respectively, to the signal-to-noise ratio.

In the simplest case, the evaluator AW consists of a divider or ratio former. This divider or ratio former forms a ratio of the sum M of the measured values me to the event count n, and thus forms the jitter value J.

As was previously mentioned, for a signal quality test a field strength measurement is taken along with the jitter measurement. Both measured magnitudes can be combined in an advantageous manner into a quality criterion A. A is defined as a ratio between the input field strength or level Pe and the jitter J. In FIG. 4 a broken line connects the evaluator AW to the intermediate frequency circuit ZF. The evaluator AW, which together with the adder Ad and the event counter EZ forms the evaluating circuit AS, includes in this case of two dividers or ratio formers. The first ratio former generates the jitter value J. The second ratio former generates the selection criterion A.

The jitter measurement function, which was described with the use of FIG. 1, and for which a first exemplary circuit is shown in FIG. 4, is based on the assumption that in the case of undistorted signals and in the case of limited incoming signal transition pulse sequences, exactly equal intervals of time are present between transition indicating pulses bounding on defining bit-times for logical zeros and bit-times for logical ones in the incoming signal. In practice, one cannot always proceed from this assumption. Unavoidable drifts in frequency generators, unsymmetries of filters, demodulators, coupling links and operational amplifiers necessarily lead to a d.c. or zero frequency component which is superimposed on demodulated or base band incoming signal. The d.c. component represents a degree of interference, the amount of which depends upon the absolute magnitude of the d.c. component.

Figure 3:
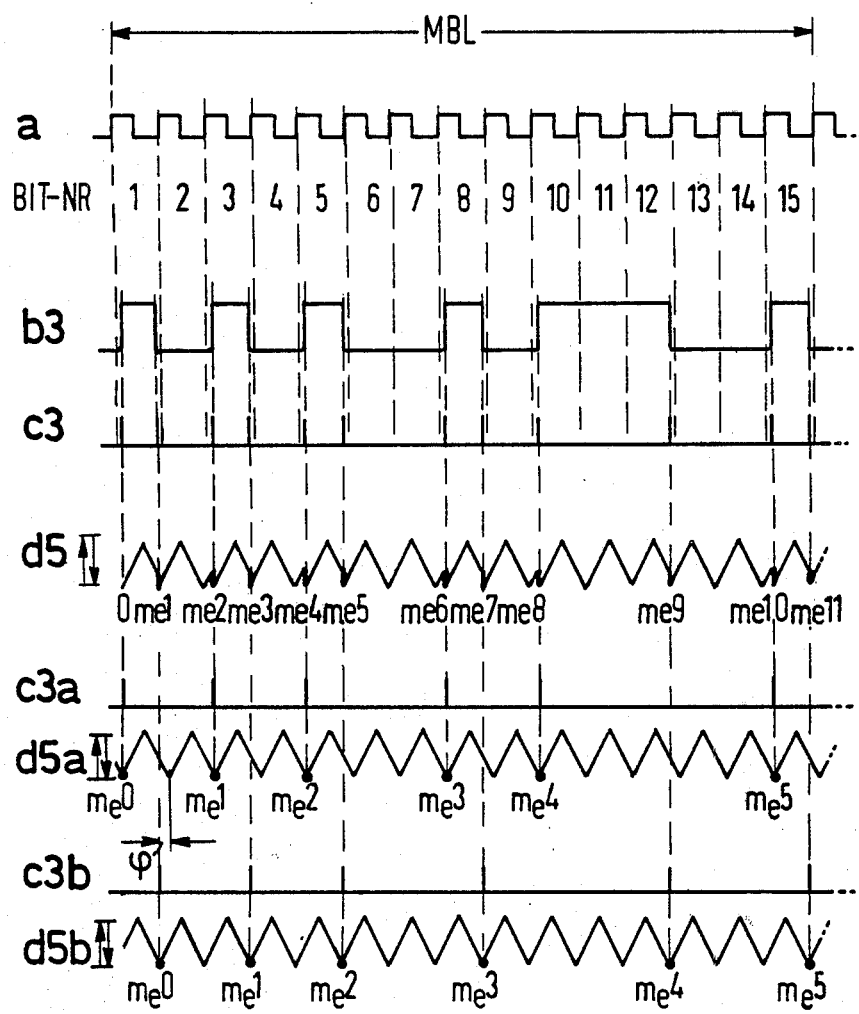
FIG. 3 is a further series of voltage waveforms plotted over time which further assist in understanding the invention.

The phase jitter measurement is distorted by this magnitude of interference, because, for example, all of the "zero" logical states are temporally longer than all of the "one" logical states. This is clarified in the diagrams of FIG. 3, which correspond to those of FIG. 1 except for this variation. The signal which is represented in diagram "b3" in the base band position of FIG. 3 is undistorted. Nevertheless, it displays an overlaid d.c. component, which expresses itself in an unequal mark-to-space ratio. The transition indicating pulses according to diagram "c3" thus do not coincide with the positive edges of the bit sequence according to diagram "a". As a result, non-zero measured values me1, m32 . . . m311 are produced at the output of the time function generator corresponding to the diagram "d5".

In order to eliminate the above described interference, it is only necessary to limit measuring values of the function of diagram "d5" to those associated with pulses of diagram "c3" generated by only positive-going transitions from diagram "b3" or negative-going transitions from diagram "b3" of FIG. 3. In FIG. 3, in diagram "c3a" and "c3b", respectively, the transition indicating pulses which are derived from the positive, or respectively, from the negative-going transitions of the signal pulses in diagram "b3" of FIG. 3 are shown. The associated diagrams for the time functions corresponding to the diagrams "c3a" and "c3b" are shown in the time diagrams "d5a" and "d5b". In the diagrams "d5a" and "d5b", the measured values me1, me2 . . . me5 respectively are in each case zero, corresponding to an undistorted signal. Because of this change, however, the number of the measurements is cut in half over the measuring block length MBL. In order to attain comparably good results with respect to the mean of several measured values, it would be necessary to double the measured block length if the transition pulses associated with only one polarity of transition of the incoming signal were used. Alternately, as the diagrams "c3a"/"d5a" and "c3b"/"d5b" make clear, the measured values me1 . . . me5 which are associated with the transition indicating pulses according to the diagrams "c3a" and "c3b" may be ascertained independently during the length of the measuring block MBL and added together to form a sum which is then divided by the total number of transitions sensed during the test block MBL.

Figure 5:
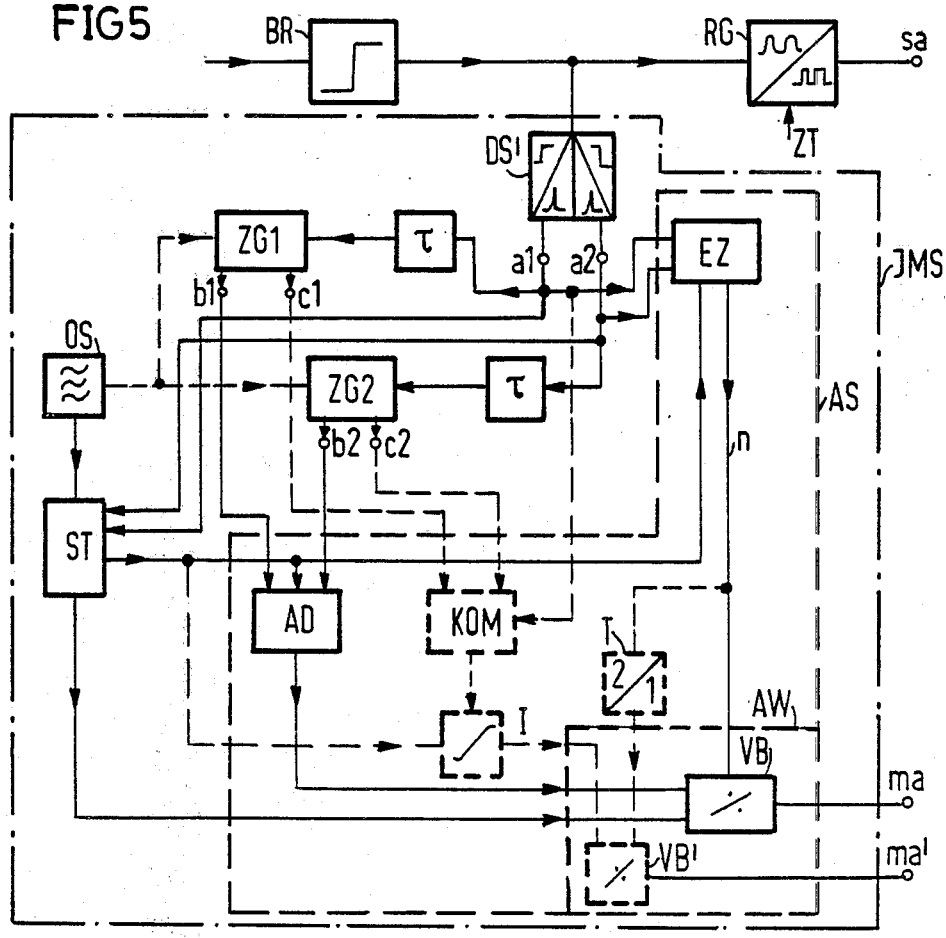
FIG. 5 is a block diagram of a second exemplary circuit practicing the method of the invention.

FIG. 5 shows a circuit embodiment incorporating the enhanced method described above with respect to FIG. 3. A differentiating circuit DS' has two outputs a1 and a2. At the output a1, a transition indicating pulse train appears which is derived from the positive-going transitions of the incoming signal in diagram "b2" of FIG. 3. At the output a2, a transition indicating pulse train appears which is derived from the negative-going transitions of the incoming signal. Both pulse sequences are fed on the lines a1, a2, to the event counter EZ for common counting. On the other hand, now two time function generators ZG1 and ZG2 are needed. The control inputs of the generators ZG1, ZG2 are each connected via a time delay device τ with a corresponding one of the two lines a1 and a2 of the differentiating circuit DS'. A time function value output b1, b2 of each of the two time function generators ZG1, ZG2 is connected to the adder AD of an evaluating circuit AS. As the values me0 . . . me5, corresponding to diagram "d5a" of FIG. 3, are formed they are added together in the adder AD to the values me0 . . . me5, corresponding to diagram "d5b" of FIG. 3 during the length of the test block MBL. This sum is fed to an evaluator AW which includes a ratio former or divider VB. The divider VB also senses the count n in the event counter EZ to form the ratio.

In further embodiment of the invention, the circuit according to FIG. 5 includes a device which can determine the magnitude and sign of the d.c. component which is represented in FIG. 5 in broken lines. The evaluating circuit AS includes a comparator KOM, which is clocked by means of the transition indicating pulse stream on the output a1 of the differentiating circuit DS'. The two inputs of the comparator KOM are connected with additional outputs c1 and c2 of the time function generators ZG1 and ZG2. The time functions of the two time function generators ZG1, ZG2 occur at the outputs c1 and c2. The comparator KOM compares the two time functions with one another and delivers a differential result with a magnitude and sign value at the point in time of the appearance of a transition indicating pulse at the output a1 of the differentiating circuit DS' to the integrator I. The integrator I receives a reset signal periodically with each measuring block length MBL. The output of the integrator I serves as one input to a second divider or ratio former VB'. The count result n of the event counter EZ is fed via a divide by two divider T2:1 to the second input of the ratio former VB'. The output magnitude of the further ratio former VB' can be sensed at a second output ma' of the evaluating circuit AS. The signal on line ma' has a magnitude and sign proportional to the d.c. component of the incoming signal on diagram "b2" of FIG. 2.

An equalizer circuit, internal to the receiver, to compensate for the d.c. component can be driven with the signal on the line ma'.

Figure 6:
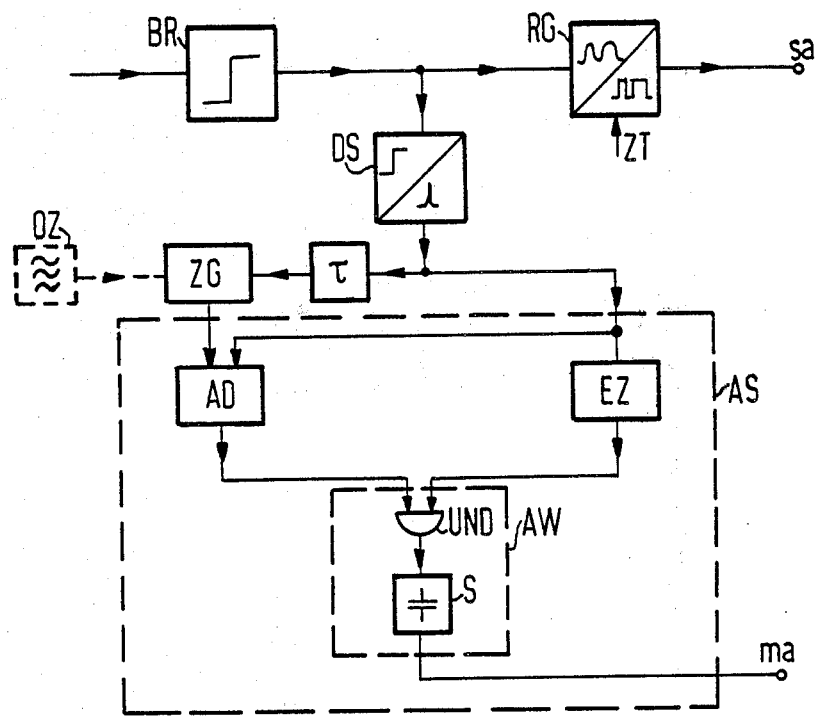
FIG. 6 is a block diagram of a third exemplary circuit practicing the method of the invention.

If the phase jitter measurement is employed solely to monitor the signal-to-noise ratio S/N of directional radio links or tropo-scatter links, then the evaluating circuit AS can be simplified. In this case, the adder AD and the event counter EZ do not require a control device. Additionally, the evaluator AW can be realized by a coincidence circuit with storage characteristics. A corresponding embodiment is shown in FIG. 6. The evaluator AW here includes, on the input side, an AND gate UND. The output of the AND gate UND is connected with the memory S. If an up-down counter is used to generate the time function in the generator ZG, and if a counting frequency fz, which is equal to one hundred times the bit frequency fd of the incoming digital signal, is used to count the counter, the jitter value can be indicated directly in percent without further conversion by an indicator device which is connected onto an output line ma. A translation is, of course, also possible directly into a signal-to-noise ratio indication.

Figure 7:
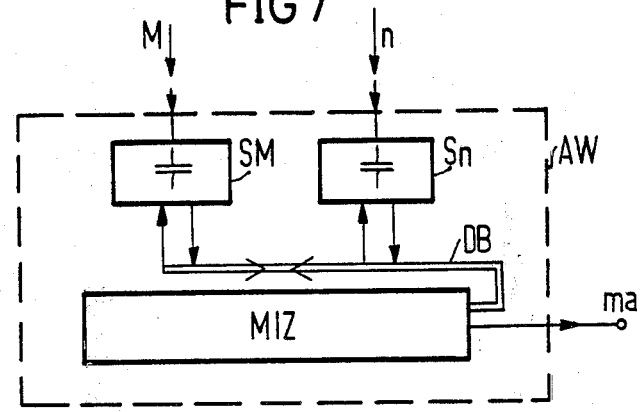
FIG. 7 is a block diagram of an exemplary evaluator usable in a circuit according to FIG. 4 or 5.

If the value of the phase jitter is to be determined for radio systems which can automatically adapt to the best receiving ratios in each case, then the evaluator AW cannot be designed in the simple manner, as is the case with the embodiment forms according to the FIGS. 4 through 6. The evaluator in this instance must be expanded by means of additional logic circuits. This expansion is realized practically by means of a microprocessor. A corresponding circuit is shown in FIG. 7. A microprocessor MIZ is connected via a data bus DB with two memories SM, Sn. The sum value M from the adder is fed to the input of the memory SM. The count result n of the event counter is fed to the input of the memory Sn. The memories SM and Sn serve as temporary storage. The values which were read into the memories SM, Sn then proceed via the data bus DB, means of addresses, into the microprocessor MIZ. The quotient is then formed in the microprocessor MIZ.

Figure 8:
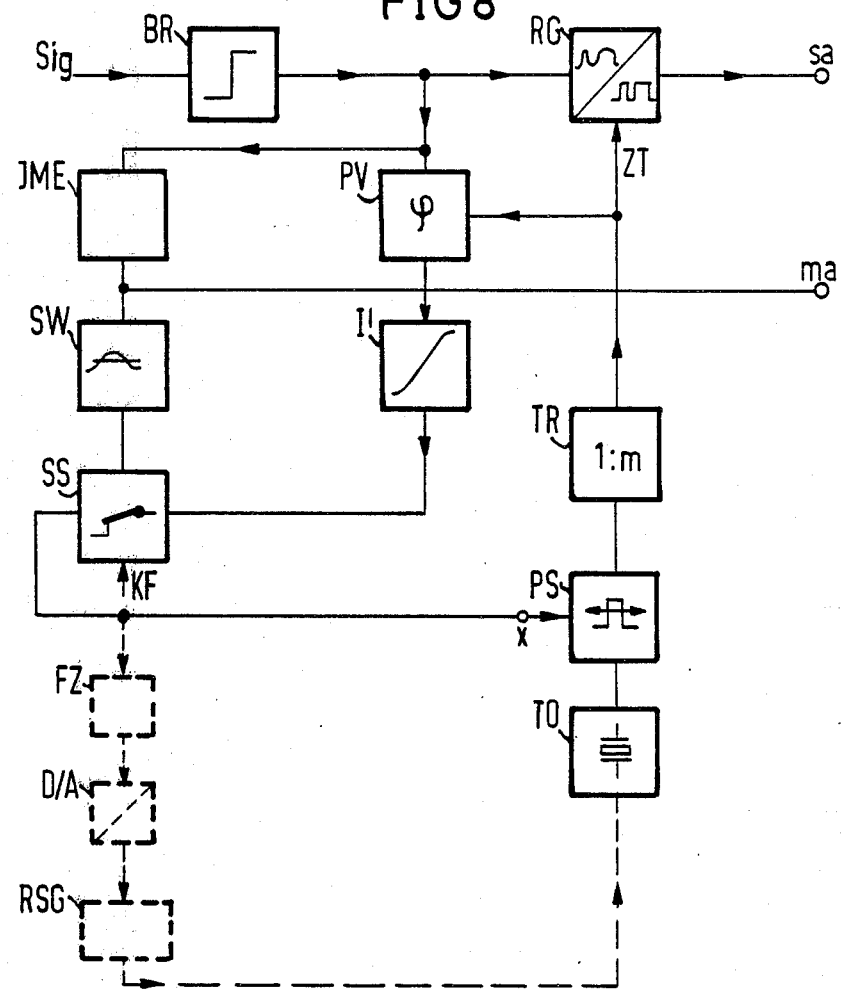
FIG. 8 is a receiver-side block diagram incorporating a circuit according to FIG. 4 or 5.

A general problem in the case of radiotelegraphy is that, because of the locality-dependent distribution of the receiver energy, and under the influence of topographical given conditions, radio pocket zones arise. If a mobile station is located in such a radio pocket zone, then as a rule, it receives only noise, which leads to the result that the regenerator, which was initially locked to the phase of the incoming signal, drifts in an undefined fashion. As soon as radiotelegraphic contact is again established, the regenerator must synchronize once again, thereby losing time. This is a considerable disadvantage particularly in the case of modern, fast frequency changeable systems. This disadvantage can be overcome if, according to a further embodiment of the invention, the jitter measuring device is used in a suitable manner in the synchronizing device to control the function of the phase regulating loop of the time pulse oscillator. FIG. 8 is a block diagram schematic of a corresponding circuit.

In FIG. 8, a timing pulse train ZT for a regenerator RG is generated by a time pulse oscillator TO and passed through a phase corrector PS and a frequency divider TR. The frequency divider TR has a division ratio 1:m. To synchronize the timing pulse generator TO, a phase regulating loop is provided. This phase regulating loop includes a phase comparator PV. One input to the comparator PV is supplied from the output of the base band delimiter BR. A second input to the comparator PV is the timing pulse to the input of the regenerator RG. The output of the base comparer PV is connected to the integrator I'. The integrator I' generates the actual regulating signal and is conventionally connected directly to a set input x of the phase corrector PS. According to the invention, in the path between the output of the integrator I' and the set input x, a controllable switch SS is arranged. A control input to the switch SS is connected via a threshold circuit SW to the output line ma of the jitter measuring device JME according to the FIG. 4 or 5. The threshold circuit SW is designed such that via it, the switch SS is opened and as a result, the supply of control signals to the set input x of the phase corrector PS is interrupted, if the initial magnitude of the jitter measuring device JME exceeds a value which indicates a total or high percent of signal loss. An undefined drifting off of the timing pulse generator in the time interval of this interference phase is thus suppressed. As a rule, after the end of this interference phase, a new synchronization of the timing pulse generator TO is not necessary. The switch SS additionally has a further control input, via which the controlling can be interrupted by means of a correction release signal KF, if this is desirable due to the presence of an organization dependent control.

A further improvement in regeneration characteristics is achievable by locking the frequency of the timing pulses ZT to the timing pulse frequency of the incoming side digital signal in addition to controlling the phase of the timing pulses ZT supplied to the regenerator RG. In FIG. 8, this frequency readjustment is shown by a series of broken line elements. It consists on the input side of an error counter FZ which is connected to the set input x to the regulating loop. A digital-analog transducer D/A is connected to the output of the error counter FZ. The output of the digital-analog transducer D/A is connected via a regulating signal generator RSG to a control input of the timing pulse oscillator TO.

The set pulses which are released by means of the jitter measuring device JME via the switch SS to the phase corrector PS, which posses either a positive or a negative operating sign, are simultaneously fed to the error counter FZ. The counter FZ assumes a mean count position where the frequency of the timing pulses ZT and the frequency of the incoming signal correspond. In the case of a frequency deviation between the timing pulses and the incoming signal, the error counter FZ leaves this mean count position and, via the digital-analog transducer D/A activates the regulating signal generator RSG, which then adjusts the frequency of the timing pulse oscillator in the desired direction in small steps. Here, too, with the assistance of the switch SS, which is controlled by the jitter measurement device JME, the frequency of the oscillator TO is prevented from drifting in an undefined manner away from the frequency of the incoming signal in the case of signal breakdown.

If in the case of automatic mobile or stationary radio devices, a connection is to be established, initially a digital signal exchange takes place. This signal exchange serves for the mutual identification. This signal exchange is necessary both in the case of fully digital connections, as well as in the case of analog connections. The phase jitter indication generated asynchronously by the inventive circuit, during the initial buildup phase of a connection, may be used to determine very quickly whether the connection is suitable or unsuitable for the intended purpose. In the case where the phase jitter measurement indicates that suitability is found lacking, the connection may be immediately dissolved. An automatically adapting channel seeking method can then begin a connection buildup on another channel immediately in this case.

Also, automatic monitoring of the connection during the message exchange is possible with the phase jitter measurement circuit according to the invention, because with this kind of jitter measurement, the current value of the signal-to-noise ratio can be made available continuously, independently of the receiving level.

This situation is more difficult in the case of analog land, mobile, radio-telephone, message exchanges. It has not been possible previously to measure the signal-to-noise ratio of an analog channel during a conversation. This is a great disadvantage to the extent that in the case of land mobile radio-telephone communications, the computation of rate must necessarily be made dependent upon the quality of the link. However, since for a quality test only the receiving level criterion is available, when a strong interference overlies the actual signal, the computation of the rate continues despite the possible collapse of the link.

The inventive circuit for asynchronous phase jitter measurement can also be used in the case of analog signal transmission in a further embodiment of the invention, if a short digital identification code of few milliseconds duration is inserted into the mutual identification signal flow in longer time intervals (around 1s). If then the desired connection is dostorted, then in the case of strong interference, the identification code will drop out completely and interrupt the connection. If the interference only reaches a certain degree which does not yet lead to a drop out of the identification code, but the understandability has been reduced by too great an extent, then this can be determined by means of a measurement of the phase jitter of the identification code blocks according to the invention. Where necessary the connection can be then dissolved, after a corresponding integration time. The phase jitter measuring device is activated only during the identification code blocks in this environment. The mixing-in of the identification code blocks into the analog speech is practical if done periodically, in one second intervals. If the answerback codes are inserted in one second intervals, no noticeable interference with the speech understandability occurs. The answerback code blocks are removed again on the receive side from the low frequency NF signal and the short holes are closed again in the simplest case by means of mixing-in of an echo.

Figure 9:
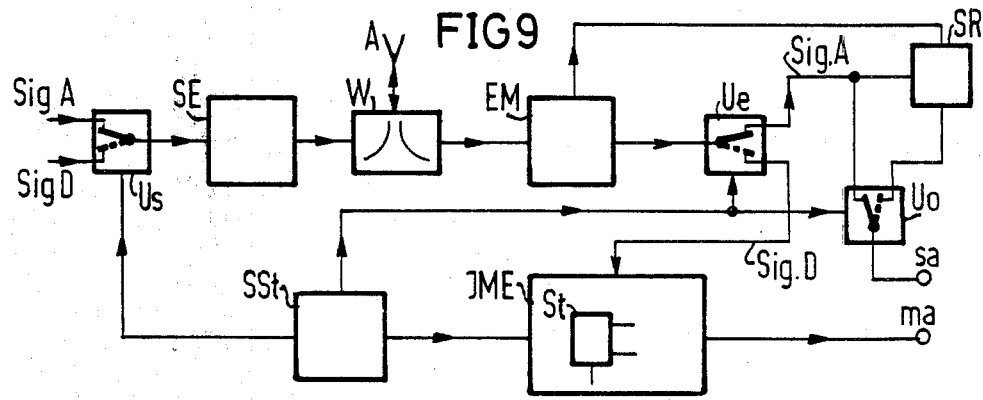
FIG. 9 is a block diagram of a send-receive circuit incorporating a circuit according to FIG. 4 or 5.

A corresponding embodiment example for such a send-receive station is shown schematically in FIG. 9. The send-receive station includes a sender SE and a receiver EM, which are connected with one another via a control transfer unit W to the antenna A. On the modulation side of the sender and on the low frequency NF side of the receiver, in each case a switch Us and Ue is arranged. The switches Us, Ue are activated periodically at selected time intervals by a common control device SSt. The analog signal Sig A and the digital signal Sig D are fed to the switch contacts of the send-side switch Us. In one second intervals the switch Us is brought into a digital signalling position, indicated by an interrupted line, for several milliseconds. In this manner, a digital identification code block is mixed into the analog signal flow. On the receiving side, by means of the switch Ue, the digital signal Sig D is removed from the analog signal flow in the same manner, and is fed to the jitter measurement device JME.

A third switch Uo, has a pole contact which forms an analog signal output sa. The analog signal Sig A is supplied by one output of the switch Ue to an input to the shift register SR and to a contact to the switch Uo. If the switch Uo is in the position shown in solid in FIG. 9, the analog signal Sa is applied directly to the output line sa. The switch Uo changes state simultaneously with the switches Us, Ue. When the control device SSt causes the switch Uo to change state, the analog signal Sig A is no longer applied to the output line sa. Instead, the previous several milliseconds of the analog signal Sig A that have been stored in the shift register SR are applied to the output line sa. In this manner, the signal hole in the output analog signal is closed.

In the recognition of digital signalling codes, for example, starting signalling, it is necessary to evaluate the incoming digital bit pattern by means of a phase jitter measurement from transition to transition, both in jitter as well as for the mutual temporal relation and polarity of the signal transitions. An evaluation of this sort can be carried out practically by a microprocessor.

Figure 10:
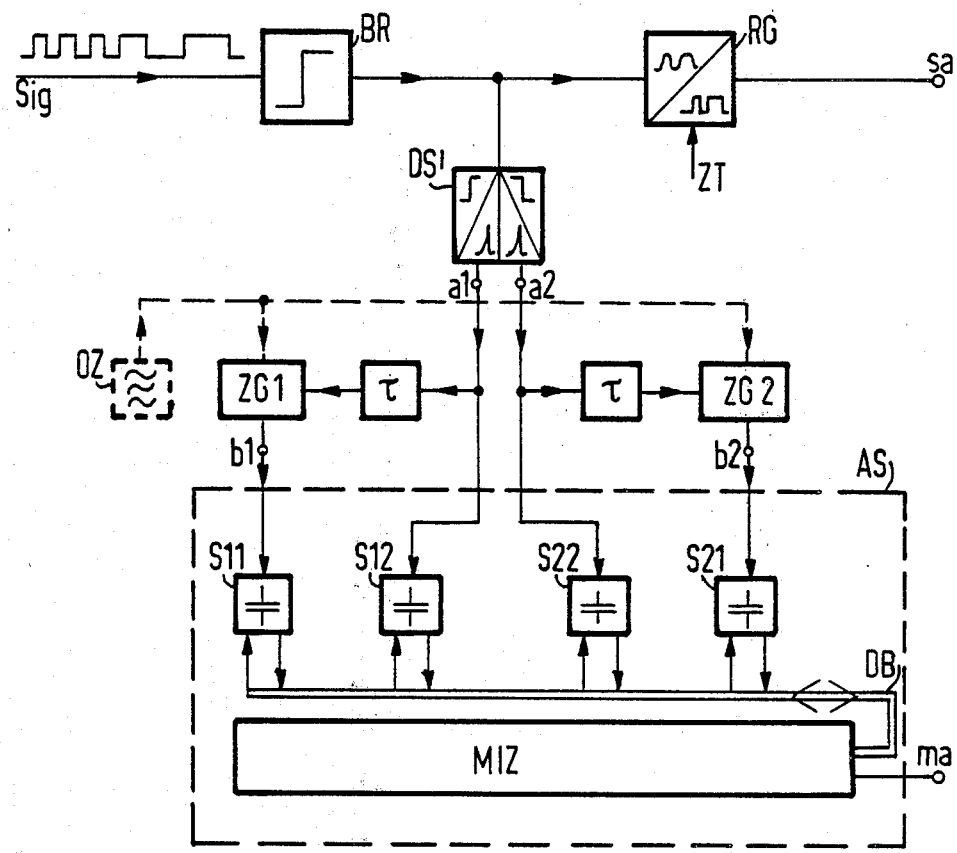
FIG. 10 is a block diagram of a further circuit according to the invention.

A corresponding embodiment is shown in FIG. 10. The circuit of FIG. 10 makes use of a differentiating circuit DS' corresponding to FIG. 5 and, via its two outputs a1 and a2, respectively, provides a control input of one of the two time function generators ZG1 and ZG2. The event counter is not represented here, since the jitter measurement is evaluated only from transition to transition. The evaluating circuit AS shows the microprocessor MIZ, which is connected via a data bus DB with four memories S11, S12, S22 and S21. The memories S11 and S21 thereby serve as temporary memories for the time function values, at the outputs b1 and b2 of the time function generators ZG1 and ZG2, whereas the transition indicating pulses at the outputs a1 and a2 of the differentiating circuit DS' are read into the memories S12 and S22. With this, the jitter value in the case of each transition, together with the associated polarity of the transition, are available in these memories to be accessed by the microprocessor via the data bus DB. The microprocessor MIZ compares these values continuously with an expected pattern which is stored in it. If the measured values agree with the expected pattern with respect to the temporal tolerance of the individual events and the signal sequence, for example, a leader with a following Barker code, as is indicated in FIG. 10, then this arrangement can be employed directly for the time signal receiving.

The greatest advantage of this arrangement consists in that a time signal receiver which is so designed also automatically evaluates the current signal-to-noise ratio in each case. Measurements are excluded which, although they give the pattern, also display too high a jitter value from the viewpoint of the individual measurements as well as of the sum of the measurements.

The measuring error which occurs in the case of the jitter measurement according to the invention, because of the fact that the time function generator runs free, thus is asynchronous to the incoming digital signal sequence, can in general practically be disregarded.

If a time function generator which is realized by means of an up-down counter is assumed, and if this counter is connected by a frequency of $2^7$ times the bit frequency of the incoming signal, by a free running oscillator with a precision of $1 \cdot 10^{-3}$, then in the case of an interference-free signal corresponding to the diagram "b1" according to FIG. 1, an up-down counting error of 0.1% results applied to each individual bit. This error would represent a best signal-to-noise ratio attainable, in the case of a continuously meandering timing pulse of clearly larger than 40 dB in the end result of the jitter measurement. This signifies a transmission quality which is still high. In view of the fact that each individual measurement always begins with zero, it is assured that the accumulated error in each case does not add up from measurement to measurement.

In practice, this error can rise to approximately 1%, since in a pseudostatic text, according to its nature, longer banks of same-poled signals occur, in the case of which the up-down counter adds up the frequency error without resetting in the time in between, and then an error enlargement occurs according to the length of the bank.

Nevertheless, the problem can be completely disregarded if one proceeds from the fact that in modern radio devices, quartz generators are available with a precision of $1 \cdot 10^{-5}$. In the case of a bank of a thousand bits having the same value, an individual error of 1% will arise because of synchronism. This error is masked essentially completely because of the rarity of the event in the case of mean value formation and by the jitter conditioned by the devices.

While various modifications and changes might be proposed by those skilled in the art, it will be understood that I wish to include within the claims of the patent warranted hereon, all such modifications and changes as reasonably come within my contribution to the art.

I claim as my invention:

1. A circuit for ascertaining the phase jitter of an incoming signal which includes at least portions in digital form at the receiving side of a signal transmission link comprising:
    a differentiating circuit for converting the transitions of the incoming digital signal to a series of pulses of a selected polarity on a first output line;

a free-running function generator which produces a selected periodic time function and which has a control input;

said first output line of said differentiating circuit is connected to said control input of said function generator such that each pulse of a selected polarity on said first output line resets said function generator to an initial condition;

a means for evaluating;

said means for evaluating is connected to an output of said function generator, said means for evaluating includes means for sensing output values of said function generator simultaneously with the appearance of said pulses from said differentiator and means for calculating a measure of the phase jitter of the incoming signal, said measure comprises a mean value of a plurality of said sensed outputs of said function generator.

2. The circuit according to claim 1, wherein said output of said function generator has a period equal to a bit time of the expected incoming signal.

3. The circuit according to claim 1, wherein said function generator is a saw-tooth wave generator.

4. The circuit according to claim 1, wherein said function generator is a triangular wave generator.

5. The circuit according to claim 1, wherein said function generator comprises a means for counting adapted to receive pulses from a means for pulse generation; said means for pulse generation is adapted to generate pulses having a period a selected amount smaller than the expected bit times of the incoming signal.

6. The circuit according to claim 5, wherein said means for counting is an updown counter.

7. The circuit according to claim 1, wherein said differentiating circuit includes a second output line; said differentiating circuit generates a pulse train on said first output line corresponding to each transition of the incoming digital signal sensed by said differentiating circuit having a first polarity, said differentiating circuit generates a pulse train on said second output line corresponding to each transition of the incoming digital signal having a polarity opposite said first polarity; a second function generator having a control input; said control input of said second function generator is connected to said second output line of said differentiator such that each pulse on said second output line resets said second function generator to an initial condition, each said function generator has an output connected to said means for evaluating; said means for evaluating is adapted to measure the phase jitter of the incoming signal as well as any d.c. component thereof.

8. The circuit according to claim 1, wherein said means for evaluating comprises a means for adding, a means for counting events, and said means for calculating; said means for adding is connected to said function generator, said means for counting events is connected to said differentiator circuit to provide a count of said pulses generated by said differentiating circuit; an output of said adder and an output of said means for counting events are connected to said means for calculating, said means for calculating is adapted to calculate the mean value of the plurality of sensed outputs from said function generator.

9. The circuit according to claim 8, wherein said means for evaluation comprises a means for forming a ratio between a sum generated by said means for adding, over a selected interval of time, and the contents of said means for counting events accumulated over said selected interval of time.

10. The circuit according to claim 8, wherein said means for evaluation comprises a means for sensing a coincidence between a selected output of said means for adding and a selected output of said means for counting events and including a means for storage to store said selected output of said means for adding.

11. The circuit according to claim 8, wherein said means for evaluation comprises a microprocessor having a first and second selectively readable memory.

12. The circuit according to claim 7, wherein said means for evaluation comprises further a means for comparison operative to compare the output value of each said function generator, upon receipt of a selected pulse from said differentiating circuit, an integrator operatively connected to an output of said means for comparison; a means for providing a count corresponding to one-half the number of transitions of the incoming signal sensed during a selected time interval; a second means for forming a ratio having a first input connected to an output of said integrator and a second input connected to an output of said means for providing a count, said second means for forming a ratio being operative to divide said integrated output providing a count from said integrator by said output of said means for thereby forming a value proportional to a d.c. offset of the incoming digital signal.

13. The circuit according to claim 7, wherein said means for evaluating comprises a microprocessor with a first and a second memory adapted to temporarily store a first and a second set of function values corresponding to said output values of said first and second function generators upon receipt of a respective pulse on said first and second output lines of said differentiator; said first and second memories being adapted to be accessed by said microprocessor.

14. The circuit according to claim 13, including further a third and a fourth memory adapted to store said first and second pulse trains respectively generated by said differentiating circuit on said first and second output lines; said third and fourth memories also being adapted to be accessed by said microprocessor.

15. A circuit for asynchronously measuring the phase jitter between the actual bit times of a signal, at least a portion of which includes digital signals, and the expected bit times of the signal, comprising:

means for sensing transitions in the digital portions of the signal, means for generating a selected periodic time varying function;

means for setting said means for generating to a selected initial value responsive to each said sensed digital transition;

means for sensing values of said periodic time varying function adapted to form a mean value of the phase jitter of the incoming digital signal.

16. The asynchronous jitter measuring circuit according to claim 15, comprising further;

means for evaluation including means for accumulating said sensed values of said periodic function over a selected time interval and means for forming a mean value of said sensed values.

17. The asynchronous jitter measuring circuit according to claim 16, including further, means for counting said digital transitions with said means for forming a mean value adapted to divide said accumulated sensed values by the contents of said means for counting.

18. The asynchronous jitter measuring circuit according to claim 15, wherein said means for generating a selected periodic time varying function is non-synchronized.

19. The asynchronous jitter measuring circuit according to claim 18, wherein said non-synchronized means for generating comprises:
   a non-synchronized means for generating clock pulses of a selected frequency, and
   a means for bidirectional counting adapted to controlably count said clock pulses in a selected counting direction.

20. The asynchronous jitter measuring circuit according to claim 19, with said means for setting being adapted to set said means for bidirectional counting to said selected initial value.

21. The asynchronous phase jitter measuring circuit according to claim 15, including further:
   means for sensing a d.c. component of the signal including means for generating an indicia proportional thereto.

22. A method of equalizing bit times of a digital pulse stream comprising the steps of:
   sensing transitions of the signal;
   generating first and second non-synchronized, periodic time functions;
   setting the first time function to a selected value at the sensed occurrence of any transition of the signal of a first polarity;
   setting the second time function to a selected value at the sensed occurrence of any transition of the signal opposite the first polarity;
   comparing the values of the two time functions at each sensed occurrence of a transition of the signal of the first polarity;
   averaging any difference of the compared values thereby forming an indicia proportional to variations between bit times of a first value of the signal and bit times of a second value of the signal;
   adjusting the corresponding bit times of a corresponding signal so as to minimize any sensed differences of the bit times in that corresponding signal.

23. A method of preventing undefined drifting of the phase of a pulse train generated by a synchronized oscillator at the receiving end of a transmission link, due to poor incoming signal quality, where the incoming signal has at least a digital portion comprising the steps of:
   generating a periodic time varying function;
   sensing selected transitions of the incoming pulse train;
   resetting the periodic time varying function to an initial condition each time a selected transition is sensed;
   asynchronously determining the phase jitter of the incoming signal using the generated periodic time varying function;
   sensing the magnitude of the determined phase jitter;
   interrupting, in a predetermined fashion, a phase adjusting feedback loop, which adjusts the phase of the pulse train, when the determined phase jitter exceeds a selected threshold.

24. A method of preventing undefined drifting of the frequency of a pulse train generated by a synchronized oscillator at the receiving end of a transmission link, due to poor incoming signal quality, where the incoming signal has at least a digital portion, comprising the steps of:
   asynchronously determining the mean phase jitter of the incoming signal over a selected period of time by using a locally generated periodic time varying function which is reset to an initial condition by transitions in the digital portion of the incoming signal;
   sensing the magnitude of the determined phase jitter;
   interrupting, in a predetermined fashion, a frequency adjusting feedback loop, which adjusts the frequency of the pulse train, when the determined phase jitter exceeds a selected threshold.

25. The phase jitter measuring circuit according to claim 15, including further:
   means for storing a plurality of said sensed values of said periodic time varying function;
   means for storing a selected sensed sequence of said sensed transitions of the signal;
   means for comparing each member of said stored sensed plurality of values to a preselected reference value;
   means for comparing said stored sequence of transitions of the signal to a pre-selected sequence of transitions.

26. A method of measuring the signal-to-noise ratio of an analog channel essentially simultaneously with the transmission of analog messages without substantially disrupting the messages comprising the steps of:
   interlacing, at periodic, selected time intervals, selected digital code blocks with the analog signal at the transmission end;
   continually storing a pre-selected interval of the incoming analog signal at the receive end;
   diverting a selected interval of the analog signal, at selected time periods, to a phase jitter measurement device;
   measuring, asynchronously, the phase jitter of the digital code blocks in the diverted signal periodically to form an indicia proportional to the signal-to-noise ratio of the analog channel;
   supplying the pre-stored interval of analog signal to replace the diverted interval of analog signal.

27. A method of quickly determining if a communication link between a transmitter and receiver is suitable comprising the steps of:
   carrying out an initial, digital signal exchange, for identification purposes, between a send and a receive station;
   measuring asynchronously, the phase jitter exhibited by the digital identification signals received by the transmitter or receiver utilizing a locally generated periodic time varying function which is reset to an initial condition in response to selected sensed transitions of the received digital identification signals;
   comparing the measured magnitude of the phase jitter to a predetermined value;
   interrupting the communication link if the measured value of phase jitter exceeds the predetermined value.

28. A method of testing a communications link comprising the steps of:
   sensing the transitions of the digital signal;
   storing the sensed sequence of transitions of the digital signal;
   measuring the phase jitter associated with each digital signal transition utilizing a locally generated periodic time varying function which is reset to an initial condition in response to selected sensed transitions of the digital signal;

storing a sequence of measured values of phase jitter corresponding to the stored sequence of transitions of the digital signal;

comparing the stored sequence of digital transitions to a predetermined sequence, and comparing each value of measured phase jitter to a predetermined value, interrupting the communication link if the comparison indicates that the incoming digital transition sequence does not correspond to the predetermined sequence or that the measured phase jitter exceeds the predetermined value.

* * * * *